United States Patent [19]

Delaney et al.

[11] Patent Number: 5,631,173
[45] Date of Patent: May 20, 1997

[54] METHOD FOR FORMING COLLECTOR UP HETEROJUNCTION BIPOLAR TRANSISTOR HAVING INSULATIVE EXTRINSIC EMITTER

[75] Inventors: Joseph B. Delaney, Plano; Kirk E. Bracey, Carrollton, both of Tex.

[73] Assignee: Texas Instruments Incorporated, Dallas, Tex.

[21] Appl. No.: 679,545

[22] Filed: Jul. 12, 1996

[51] Int. Cl.$^6$ .................................................. H01L 21/265
[52] U.S. Cl. ...................... 438/314; 257/197; 438/315; 438/936
[58] Field of Search .............................. 437/31, 128, 133, 437/24; 148/DIG. 10, DIG. 11, DIG. 12; 257/197

[56] References Cited

U.S. PATENT DOCUMENTS 5,266,819   11/1993   Chang et al. ............................ 257/198
5,296,389   3/1994   Shimawaki ................................ 437/31
5,298,438   3/1994   Hill .............................................. 437/31
5,434,091   7/1995   Hill et al. .................................... 437/31
5,512,496   4/1996   Chau et al. ................................. 437/31

Primary Examiner—John Niebling
Assistant Examiner—Long Pham
Attorney, Agent, or Firm—Bret J. Petersen; James C. Kesterson; Richard L. Donaldson

[57] ABSTRACT

A process and structure for an improved collector-up bipolar transistor. The base is formed after the emitter is implanted to eliminate base damage during oxygen implantation typical in prior art collector-up bipolar transistors. In a preferred embodiment, an emitter layer of GaAlAs is implanted with oxygen in the extrinsic emitter region to damage the material and make it insulative. The base is epitaxially grown at low temperature to insure the emitter material remains damaged and insulative.

11 Claims, 3 Drawing Sheets

METHOD FOR FORMING COLLECTOR UP HETEROJUNCTION BIPOLAR TRANSISTOR HAVING INSULATIVE EXTRINSIC EMITTER

The U.S. Government may have rights in this Patent under Contract Number: DAAB07-94-C-A768.

This application claims priority under 35 U.S.C. No. 119(c)(1) of provisional application No. 60/001,073, filed Jul. 12, 1995.

1. Field of the Invention

This invention generally relates to fabrication techniques and structures for collector-up heterojunction bipolar transistors. More particularly, this invention introduces a new process and structure for collector-up heterojunction bipolar transistors to eliminate base damage during oxygen implantation typical in prior art structures and processes.

2. Background of the Invention

Collector up configurations of heterojunction transistors are of particular interest because of their ability to provide low base-collector capacitance over traditional emitter up designs. Since junction capacitance limits high frequency performance of bipolar devices, this lower base-collector capacitance enables higher frequency circuits to be fabricated. Traditional heterojunction collector up transistors are fabricated from a material system such as GaAs and GaAlAs, which has a wide band gap. The extrinsic base is implanted p-type into the wide band gap GaAlAs material and the intrinsic base is placed physically inside the lower band gap GaAs base. The result is a voltage turn on for the extrinsic diode that can be several hundred millivolts higher than the intrinsic base, and current will flow primarily into the intrinsic base and enhance current gain. The draw back is the limitation on base doping and capacitance. The base can be implanted or grown in situ at epitaxy, but high doping, greater than 1E18 cm−3, causes the depletion region of the intrinsic base to extend into the emitter. Even if the emitter aluminum composition is graded over 300 to 500 Å to avoid the base, the high doped base depletion region will still reach the aluminum heterojunction and the base-emitter turn on will increase. The offset voltage between the extrinsic and intrinsic base will decrease and current gain will suffer. Both the emitter and collector doping should be kept as much below the higher base doping as possible to minimize capacitance, but the traditional collector-up structure doesn't allow this.

A solution to problems associated with these traditional collector up designs has been reported by Yamahata et. al in IEEE Electron Device Letters, Vol. 14, April 1993, incorporated herein by reference. Yamahata et. al describe a high ft and fmax collector up device. FIG. 1 shows the structure and sequence of the design proposed by Yamahata et. al. The epitaxy is grown as shown in FIG. 1a and the collector is patterned with metal. The metal is then used as a mask to etch to the base either with RIE or wet etching or both. The structure is then implanted with oxygen through the base to place the peak and a straggle of the oxygen dose below the base, as shown in FIG. 1b. The base is then zinc diffused to recover p-doping in the damaged base, with the collector protected on the sides with resist or nitride as shown in FIG. 1c. The emitter is patterned, etched to the n+, and metalized. The final device has reduced collector capacitance and a highly doped base. The extrinsic base cannot turn on because the oxygen has eliminated injection above a small leakage current.

SUMMARY OF THE INVENTION

The prior art processes and devices like those discussed above have several problems. First, the base is severely damaged during oxygen implantation which requires a very high doping in the base from zinc diffusion to make the base conductive and make up for the damage. Also, the sides of the mesa must be protected which requires an additional lithography or processing step. In addition, the active intrinsic area is limited by the size of the collector and uniformity is difficult with zinc diffusion.

In accordance with the present invention, an improved method and structure is provided for collector-up heterojunction bipolar transistors to eliminate base damage during oxygen implantation and the other problems typical in prior art structures and processes.

An embodiment of the present invention provides a collector up structure which eliminates oxygen damage by placing the oxygen into the emitter before fabrication of the base and collector. The emitter is grown on semi-insulating or n+ substrate with a n+ layer followed by a wide bandgap layer, such as GaAlAs or InGaP. The emitter is covered with nitride and masked with resist to cover the planned lateral active region of the device. Oxygen is implanted through the nitride in one or several doses. The resist and nitride are cleaned off with asher and plasma etch and the surface is again cleaned to eliminate nitride with COE. The base is epitaxially deposited at a low temperature to get maximum doping and the collector is grown at the lowest possible temperature. After epitaxy regrowth, the collector is metalized using marks created at the oxygen implant step. This mask is used to etch to the base using a thin etch stop layer.

An advantage of the present invention lies in the epitaxial regrowth. The oxygen implant is made prior to the base growth and can be made very small. Since the base has not had an oxygen implant made through it, it is therefore undamaged and highly conductive. The oxygen semi-insulating characteristic of the external emitter is not compromised where the base epitaxy is done at reduced temperatures according to the present invention. These two factors combine to give a key advantage. The undamaged base provides the lowest possible base resistance. And the semi-insulating external emitter provides the lowest possible collector base capacitance. Since the fmax is inversely proportional to the base resistance and the collector-base capacitance, fmax is optimized by these two factors. An optimized fmax is key to power circuits, linear and digital circuits where this device has application.

An additional advantage is that the collector contact can be aligned with the emitter oxygen implant after regrowth and tolerate misalignment by creating alignment marks in the emitter layer 14. The collector can tolerate misalignment because the emitter area is defined by a separate process than that of the collector. The collector can be made to overlap the emitter area to compensate for misalignment. In prior art structures, the intrinsic emitter was created below the collector and undercutting of the collector could result in the emitter active area extending beyond the collector, giving rise to capacitance and lower current gain due to the extrinsic diode.

Another related advantages is that the active area of the base can be arbitrarily chosen independent of the collector contact and therefore be made smaller. The collector size can be reduced to that used in silicon. This reduced size over prior art structures helps to reduce the capacitance.

A further advantage of the present invention is the collector thickness could be increased to 1 micron or more for high voltage applications such as those found in power amplifiers. However, there is a tradeoff between breakdown voltage and higher $f_r$. A thicker collector layer increases the breakdown voltage but lowers the possible $f_r$.

Also, while the extrinsic base will show a small sub-microamp leakage the external base/emitter diode will not turn on and lower current gain. The turn on voltages of the preferred embodiment have been experimentally verified. The intrinsic voltage was observed to turn on at about 1 V, while the extrinsic diode was observed to turn on at about 3.6 V.

These are apparently the first collector-up heterojunction bipolar transistors to eliminate base damage during oxygen implantation and the other problems typical in prior art structures and processes.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION OF THE PREFERRED EMBODIMENTS

Figure 1A:
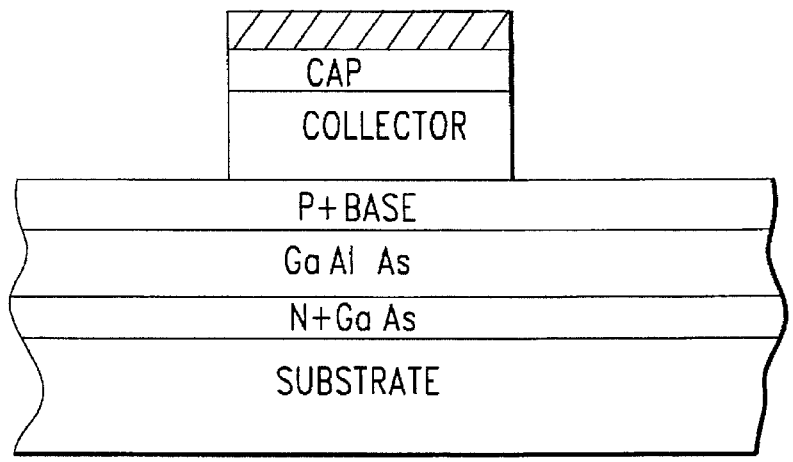
FIGS. 1a–1c illustrates a typical prior art device structure.
Figure 1B:
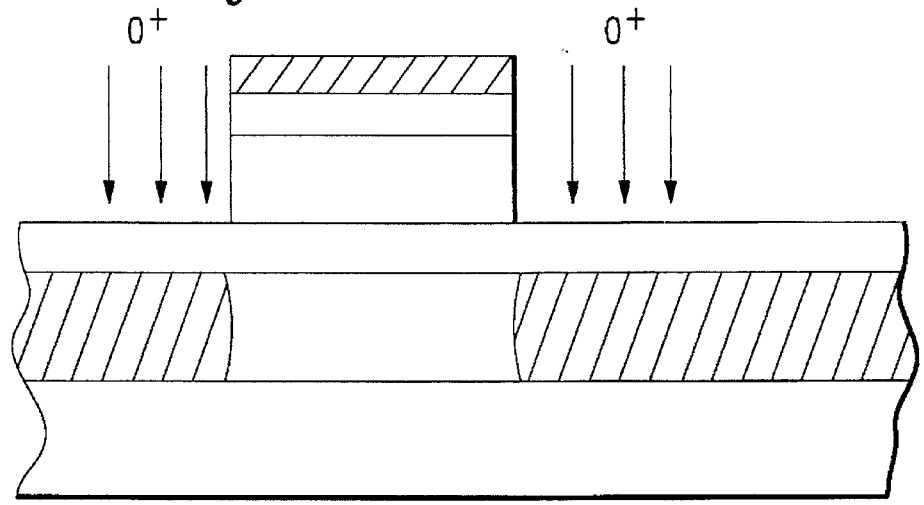
Figure 1C:
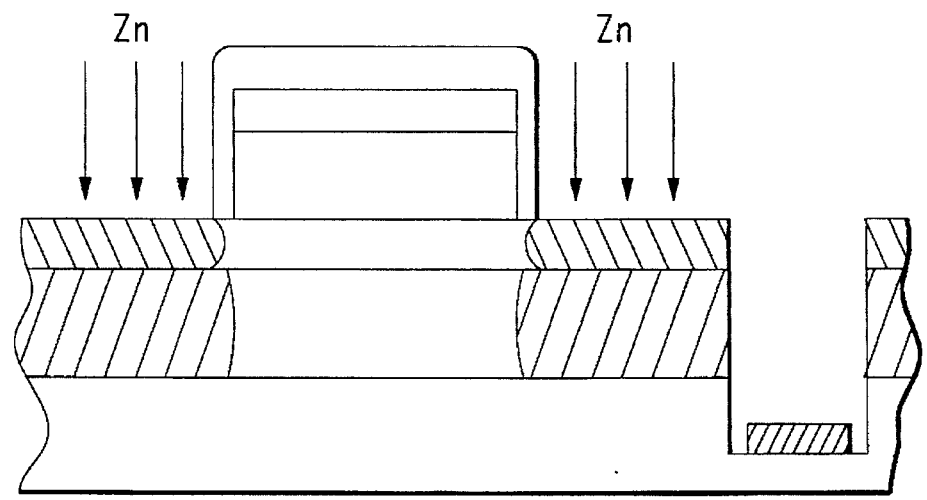

With reference to FIGS. 1a through 1c there is shown structures of the prior art which are described in further detail hereinabove.

Figure 2A:
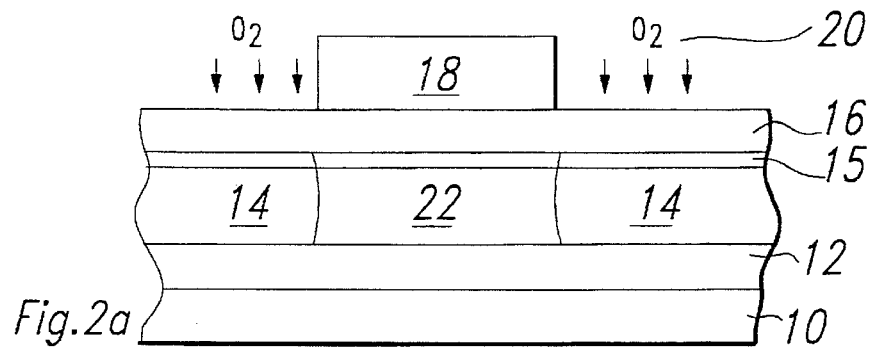
FIGS. 2a–2d shows an embodiment of the present invention in sequential steps of the fabrication process.
Figure 2B:
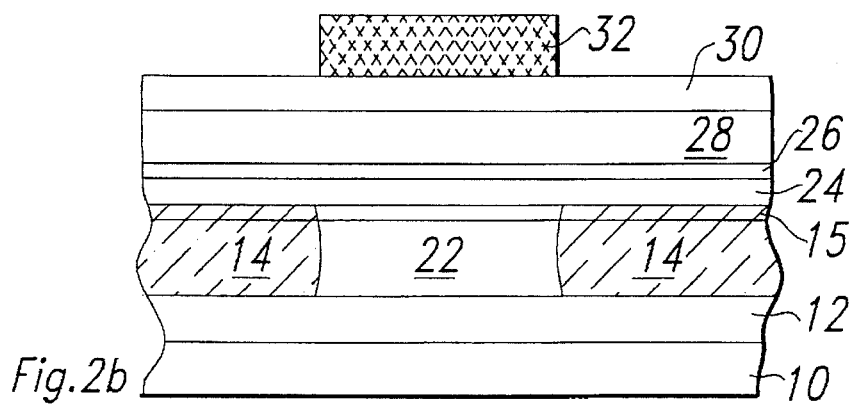
Figure 2C:
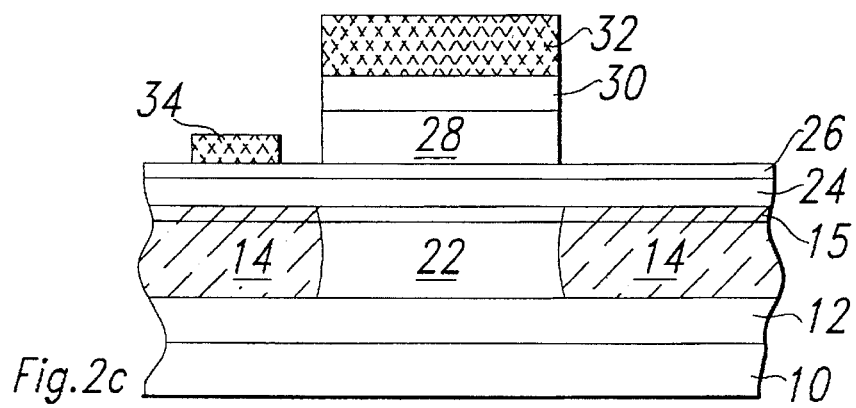
Figure 2D:
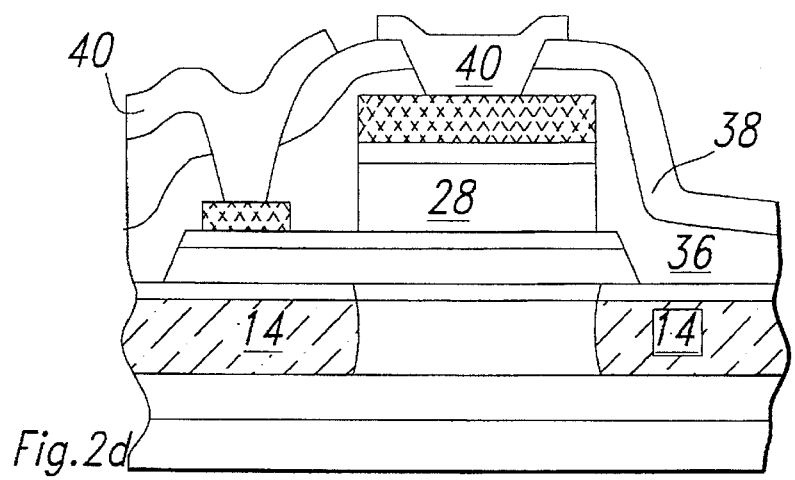

With reference to FIGS. 2a–2d, there is shown a method of forming an embodiment of the present invention which is shown in the completed structure of FIG. 2d. In each of the figures like numerals are used for like and corresponding parts of the various drawings.

Figure 3A:
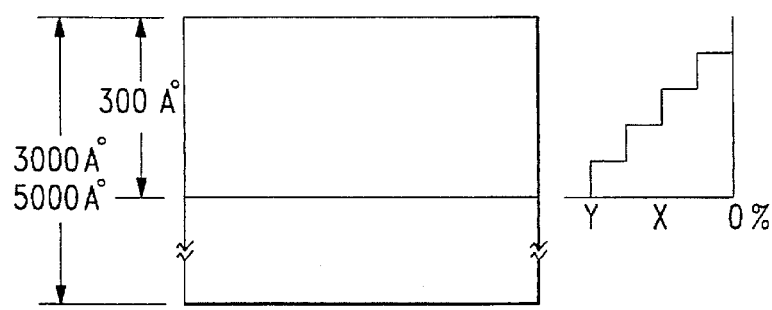
FIGS. 3a–3b illustrates the grading of the emitter layer and the contact layer for an embodiment.

The emitter contact layer, an n+ layer 12, is grown by MOCVD or MBE on semi-insulating or n+ semiconductor substrate 10 to a thickness of between 3000 Å and 1 μm. This layer is followed by a device emitter layer 14 of wide bandgap material such as GaAlAs or InGaP, as shown in FIG. 2a. The aluminum in the emitter layer is preferably graded out at the top 200–500 Å, and preferably 300 Å, as shown in FIG. 3a. The grading takes the form of $G_{1-x}Al_xAs$ where x changes from y% to 0 on the emitter to base interface. The percentage of the Al used in the grading, shown as "y" in FIG. 3a, is preferably from 20% to 40% and most preferably about 30%.

In a preferred embodiment, the emitter includes a cap layer 15. The cap is a thin (100–300 Å) layer of P+ GaAs placed on top of the wide band gap emitter to encapsulate the emitter base interface. This will optimize the emitter injection efficiency by leaving intact the emitter-base interface grown in situ. A light wet etch (100 Å) before epitaxy of the base helps to insure a good surface for epitaxial growth.

The emitter is covered with preferably 300–500 Å of silicon nitride 16 by plasma deposition. The nitride layer acts to raise the tail of the penetration profile for the oxygen implantation. This insures the oxygen implantation damage will begin at the top surface of the emitter layer. Permanent damage to the emitter layer from oxygen implantation causes the implant area to become semi-insulating which gives a lower base to emitter capacitance. Damage to the emitter layer is preferably permanent even after the temperature cycles to 700° C. as the epitaxy is grown. The nitride layer also passivates the emitter layer and protects against moisture damage. Masking material or resist 18 is applied to protect the lateral active region of the device during oxygen implantation. A preferred mask is 1.2–2.0 μm of positive resist. A combination of resist and silicon nitride may also be used. Oxygen 20 is then implanted through the nitride 16 in one or several doses (typically 50, 100 and 180 KEV). The deeper the implant, the lower the extrinsic capacitance of the device. The oxygen dose is preferably 1–2E14 $cm^{-2}$, which has been experimentally verified to maximize resistivity of the emitter after temperature cycles discussed below.

In the preferred embodiment, the oxygen implant pattern also delineates a set of lithography alignment marks self-aligned to the implant. These marks are later used to align the placement of the collector contact and base masks. A separate mask is used to open windows in the resist around the marks, the nitride is plasma etched, and the surface of the emitter layer 16 is wet etched to set the markers at an appropriate depth, preferably about 4500 Å.

After the etch of the alignment marks, the remaining resist and nitride are then removed. The resist 18 may be removed with a common asher process, while the nitride 16 may be removed with a plasma etch. The surface is preferably again cleaned to eliminate the nitride with common oxide etch (COE). For wafers sawed several degrees off a major crystal plane, nitride is preferably left over the alignment marks for protection during epitaxy. The wafer is preferably further ashered and wet cleaned with $HCL:H_2O$ and $NH3OH:H_2O$ to prepare the surface for regrowth epitaxy.

The base and collector layers described below are shown FIG. 2b. A base layer 24 of optimized low resistivity is deposited on the cleaned emitter layer 14. The conductivity of the base layer is preferably less than 400 ohms/square and more preferably less than 150 ohms/square and most preferably about 50 ohms/square. An advantage of the present invention is that the base layer will remain at this low resistivity upon completion of the device. The base layer is preferably P+ layer of GaAs grown by MOCVD. The base layer is preferably grown at a low temperature (600° C.) to get maximum doping (2–5E19 cm–3), and the collector layer described below is also grown at the lowest possible temperature, preferably less than 700° C., to not disrupt the oxygen implant. Table 1 shows conductivity of oxygen implanted into a typical high doped MESFET channel on SI GaAs. A dose of 5E12 to ABBE cm–2 and anneal below 750 C shows no conductivity after implant and temperature treatment. This is necessary to keep the semi-insulating property of oxygen implant after the regrowth of the base and collector.

TABLE 1

Oxygen Implant and Anneal Matrix
(Conductivity in Mhos/square)

| Oxygen Dose | ANNEAL Temperature | | | |
| --- | --- | --- | --- | --- |
|  | 550° C. | 650° C. | 750° C. | 850° C. |
| 5E11 $DM^{-2}$ | 0.0000 | 0.0004 | 0.0009 | 0.0020 |
| 1E12 | 0.0000 | 0.0003 | 0.0008 | 0.0017 |
| 5E12 | 0.0000 | 0.0000 | 0.0005 | 0.0022 |
| 1E13 | 0.0000 | 0.0000 | 0.0003 | 0.0019 |
| No Implant | 0.0036 | 0.0036 | 0.0035 | 0.0036 |

Figure 3B:
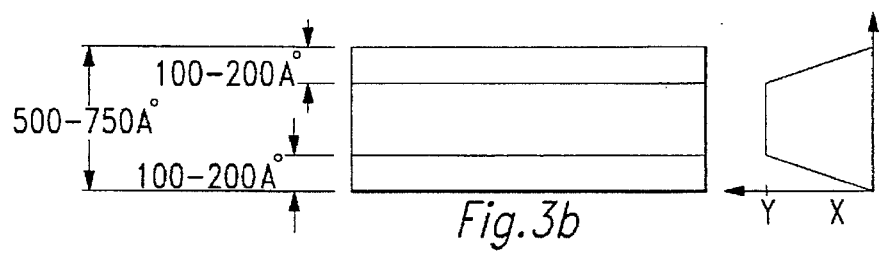

An etch stop layer 26 of a wide band gap material, preferably 500–750 Å of GaInAs, is then grown on the base layer 24. Using GaInAs as an etch stop for a collector-up transistor is described in U.S. Pat. No. 5,296,389, issued to Shimawaki, and incorporated herein by reference. The etch stop layer is preferably graded for 100–200 Å on each side of the layer as shown in FIG. 3b. The grading takes the form of $Ga_{1-x}In_xAs$ (or $Ga_{1-x}Al_xAs$) where x changes from 0 to y% on the etch stop layer to base interface and then from y% to 0 on the etch stop to collector interface. The percentage of the Indium or Al used in the grading, shown as "y" in FIG. 3b, is preferably from 3% to 10% and most preferably about 5%. A different compound at the base-collector interface serves two purposes. First, an etch stop is provided for subsequent process steps because the selectivity of InGaAs and GaAlAs over GaAs, using chlorine base RIE for InGaAs and chlorine based RIE with $SF_6$ for GaAlAs, is approximately 100:1. Second, the wide band gap GaAlAs stops hole injection into the collector when the transistor is driven into saturation. While the narrow bandgap InGaAs makes a low barrier to electron injection and can increase $f_t$.

The collector 28, an N− layer of GaAs, is epitaxially grown on the base and etch stop layer 26. The collector is preferably low doped, typically 1E16 $cm^{-3}$ n-minus or less, to maximize Early-Voltage and minimize collector capacitance. Thickness of the collector layer can be 2000 Å to 10,000 Å. However, there is a tradeoff between breakdown voltage and higher $f_t$. A thicker collector layer increases the breakdown voltage and lowers capacitance but lowers the possible $f_t$. The collector is preferably followed by a cap layer of N+ GaAs 30 which facilitates n-contact or a schottky barrier diode for a collector contact.

After epitaxy regrowth, the collector is metalized 32 using marks created at the oxygen implant step (and protected at epitaxy with nitride). This metal contact can be used as a mask to etch to the base using the dry RIE etch described above to stop on the thin (500 to 750 Å) etch stop layer as shown in FIG. 2c.

The base contact 34 can be AuZn and reside on the stop layer, which is depleted, and after alloy at 400° C., the AuZn penetrates to make contact with the base. Alternatively, a wet etch to reveal the base allows TiPtAu to make a contact to the p+ surface.

An isolation mask is used to cover the transistor and the remaining p+ base is wet etched away to leave the base as shown in FIG. 2d. Boron or oxygen can be shot into the surface of the emitter layer surrounding the transistor to further damage the emitter layer and complete the isolation.

After forming the base metalization and completing isolation, the entire structure may be covered with a dielectric material. The dielectric is preferably 2000 Å–3000 Å of plasma deposited Silicon Nitride $SiN_4$ 36 followed by $SiO_2$ 38. The dielectric is then etched to form vias to the base and collector contacts as shown in FIG. 2d. Metalization 40 is then applied to interconnect the device. Typically, a second dielectric layer is needed, with vias and metal contacts to complete the interconnection of the circuit.

For a semi-insulating substrate, the emitter contact may be made by masking the emitter contact area adjacent to the device and dry or wet etching to the n+ sub-emitter, metalizing with AuGeNiAu and liftoff. For a n+ substrate, the backside may be metalized with AuGeNiAu. Schottky diodes can be placed on the original collector surface with a TiPtAu liftoff pattern next to the ohmic contact, and a diode protect mask used to cover the diodes at base etch.

Figure 4:
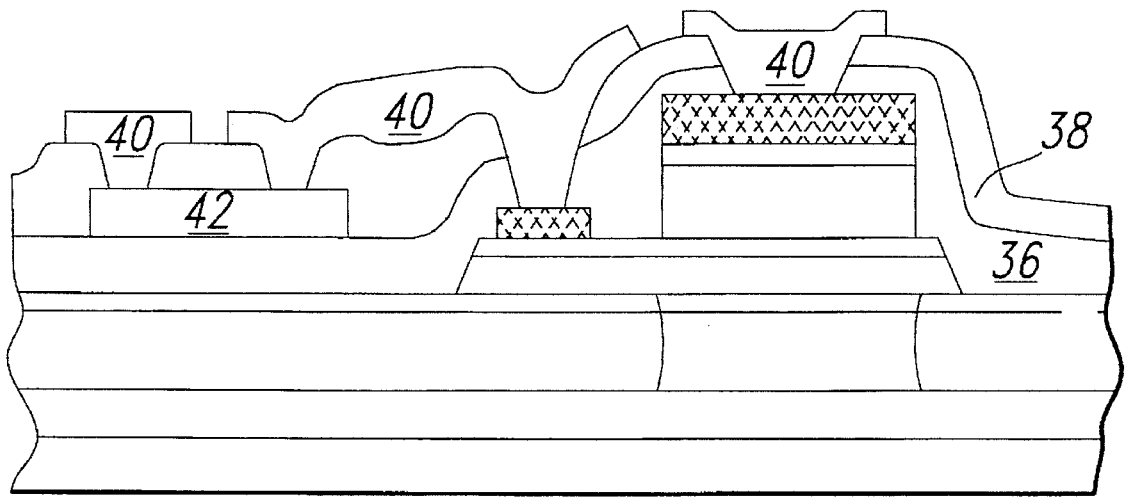
FIG. 4 shows an embodiment of the present invention which includes a load resistor.

The uniqueness of the structure lies in the regrowth. The oxygen implant is made prior to the base growth allowing the intrinsic emitter to be made very small. Since the base has not been exposed to an oxygen implant, it is therefore undamaged and highly conductive. The oxygen semi-insulating characteristic has not been compromised if the epitaxy temperature is maintained in the correct region, as shown in Table 1. The extrinsic base will show a small sub-microamp leakage but will not turn on and lower current gain. In addition, the extrinsic base capacitance is reduced. The device can be scaled to sub-micron dimensions with stepper technology. FIG. 4 shows a log I–V and linear I–V plots for the completed intrinsic and extrinsic diodes obtained from the above embodiment of the present invention.

Using an ohmic contact on the collector and isolating each collector with the stop etch on the base prevents collector to collector leakage in the circuit, due to the back to back diodes. Voltage swing is between the saturated ohmic transistor in the low state and a Vbe turn on in the high state, allowing sufficient margin and gain for shrinking the device. The transistor can integrate linear and digital in one circuit, using collector top or emitter top with the additional heterojunction at the base-collector interface. HI2L logic on a semi-insulating substrate can be combined with linear applications using differential amplifier blocks. This is done by taking the emitter ground out the top on a ground bus, or etching through a thinned substrate (100 um) with conventional back side vias to stop on emitter metal under the HI2L logic blocks.

An additional embodiment of the present invention, shown in FIG. 4, includes a thin film load resistor 42 fabricated on the nitride layer 36 prior to the diode formation and likewise protected during base etch. The load resistor may be connected to the base contact with metalization 40 as shown. This resistor is preferably fabricated by sputter deposition of Cermet (CrSiO) and ion mill patterning.

Table 2, below, provides an overview of some embodiments and the drawings.

TABLE 2

| Drawing Element | Preferred or Specific Examples | Generic Term | Other Alternate Examples |
|---|---|---|---|
| 10 | Gallium Arsenide | Substrate | Other single component semiconductors (e.g. germanium, diamond) or Compound semiconductors (e.g. GaAs, InP, Si/Ge, SiC) |
| 12 | n + layer | Emitter Contact Layer | |
| 14,22 | GaAlAs | Emitter | Other wide band gap materials such as InGaP. |
| 16 | Nitride | Protective Layer | |
| 18 | Etch resist | Photoresist | Any compound suitable for semiconductor processing techniques which has the selectivity required for the process of this invention |
| 20 | oxygen | | |
| 24 | P + GaAs | Base layer | |
| 26 | GaInAs | Etch stop | GaAlAs |
| 28 | N − GaAs | Collector layer | |
| 30 | N + GaAs | Cap layer | InGaAs |
| 32,34 | AuZn | Ohmic Contact | TiPtAu |
| 36 | $SiN_4$ | Isolation Layer | |
| 38 | $SiO_2$ | Dielectric | |
| 40 | | Metalization | |
| 42 | CrSiO | Load Resistor | |

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of forming a collector-up microelectronic transistor structure, said method comprising steps:

(a) forming a semiconductor substrate;

(b) depositing an emitter contact layer on said substrate;

(c) depositing an emitter layer on said emitter contact layer;

(d) oxidizing said emitter layer using a mask to form an intrinsic emitter and an extrinsic emitter wherein said extrinsic emitter is insulative and said intrinsic emitter is conductive;

(e) forming a low resistivity base having an intrinsic and extrinsic portion wherein said intrinsic base is over said intrinsic emitter layer and said extrinsic base is over a portion of said extrinsic emitter; and (f) forming a collector disposed over a portion of said base.

2. The method according to claim 1, wherein said emitter layer is GaAlAs.

3. The method according to claim 2, wherein said emitter layer is step graded from about 30% to about zero at a surface towards said base.

4. The method according to claim 1, wherein said base is covered with an etch stop layer prior to forming said collector.

5. The method according to claim 4, wherein said etch stop layer is chosen from the group consisting of GaInAs and GaAlAs.

6. The method according to claim 5, wherein said etch stop layer is graded from about 3–10% at the center to 0% at a point 100–200 Å from outer surfaces according to the form $Ga_{1-x}In_xAs$ where x starts at from 3–10% and linearly reduces to 0%.

7. The method according to claim 1, wherein said collector is aligned to said intrinsic emitter using alignment marks created with the same mask as used to form the emitter layer.

8. The method according to claim 1, further comprising forming at least one load resistor adjacent said transistor structure.

9. The method according to claim 1, further comprising connecting said load transistor to said base.

10. The method according to claim 1, wherein said intrinsic emitter is smaller than said collector.

11. The method according to claim 1, wherein said emitter layer includes a thin layer of P+ GaAs added on top of the emitter layer prior to the oxidizing said emitter layer.

* * * * *